(12) United States Patent
Bristol et al.

(10) Patent No.: US 11,300,885 B2
(45) Date of Patent: Apr. 12, 2022

(54) EUV PHASE-SHIFT SRAF MASKS BY MEANS OF EMBEDDED PHASE SHIFT LAYERS

(71) Applicant: Intel Corporation, Santa Clara, CA (US)

(72) Inventors: Robert Bristol, Portland, OR (US); Guojing Zhang, Saratoga, CA (US); Tristan Tronic, Aloha, OR (US); John Magana, San Jose, CA (US); Chang Ju Choi, Fremont, CA (US); Arvind Sundaramurthy, Menlo Park, CA (US); Richard Schenker, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 749 days.

(21) Appl. No.: 16/045,253

(22) Filed: Jul. 25, 2018

(65) Prior Publication Data

US 2020/0033736 A1 Jan. 30, 2020

(51) Int. Cl.
*G03F 7/20* (2006.01)
*G03F 1/24* (2012.01)

(52) U.S. Cl.
CPC ............ *G03F 7/70308* (2013.01); *G03F 1/24* (2013.01); *G03F 7/70033* (2013.01); *G03F 7/70283* (2013.01)

(58) Field of Classification Search
CPC ..... G03F 1/24; G03F 1/32; G03F 1/36; G03F 7/70033; G03F 7/70283; G03F 7/70308
See application file for complete search history.

(56) References Cited

U.S. PATENT DOCUMENTS

| 2017/0038673 A1* | 2/2017 | Ikebe | G03F 1/24 |
| 2019/0004416 A1* | 1/2019 | Wang | G03F 1/24 |

FOREIGN PATENT DOCUMENTS

| CN | 108227391 A * | 6/2018 | G03F 7/70441 |
| WO | WO-2020179463 A1 * | 9/2020 | G03F 1/26 |

* cited by examiner

*Primary Examiner* — Peter B Kim
(74) *Attorney, Agent, or Firm* — Schwabe, Williamson & Wyatt, P.C.

(57) ABSTRACT

Embodiments described herein comprise extreme ultraviolet (EUV) reticles and methods of forming EUV reticles. In an embodiment, the reticle may comprise a substrate and a mirror layer over the substrate. In an embodiment, the mirror layer comprises a plurality of alternating first mirror layers and second mirror layers. In an embodiment, a phase-shift layer is formed over the mirror layer. In an embodiment, openings for printable features and openings for non-printable features are formed into the phase-shift layer. In an embodiment, the non-printable features have a dimension that is smaller than a dimension of the printable features.

24 Claims, 14 Drawing Sheets

EUV PHASE-SHIFT SRAF MASKS BY MEANS OF EMBEDDED PHASE SHIFT LAYERS

TECHNICAL FIELD

Embodiments of the disclosure are in the field of semiconductor fabrication, and in particular, to reticles for extreme ultraviolet (EUV) lithography.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, leading to the fabrication of products with increased capacity and functionality. The drive for ever-more capacity, however, is not without issue. Particularly, the critical dimensions are beginning to scale beyond the resolution capacity of existing lithographic patterning processes, such as deep ultraviolet (DUV) lithography.

Extreme ultraviolet (EUV) lithography allows for the critical dimension scaling to continue. However, the transition to EUV lithography has many engineering obstacles to overcome in order to be integrated into high volume manufacture operations. One particular obstacle that must be overcome is the improvement of image contrast and normalized image log-slope (NILS) of existing mask technologies. Particularly, currently available EUV reticles rely on a binary mask architecture that includes an absorber over the multilayer mirror. The absorber is patterned to have openings that will be printed on the wafer. However, the absorber (as its name implies) tends to absorb a significant portion of EUV that is desired to be reflected to the wafer and broadens the transition from light to dark (i.e., current EUV reticles have poor contrast). This is particularly problematic in EUV lithography because EUV systems are already photon starved. Accordingly, lithographic operations using EUV systems are relatively slow and have a low throughput.

DESCRIPTION OF THE EMBODIMENTS

Figure 1A:
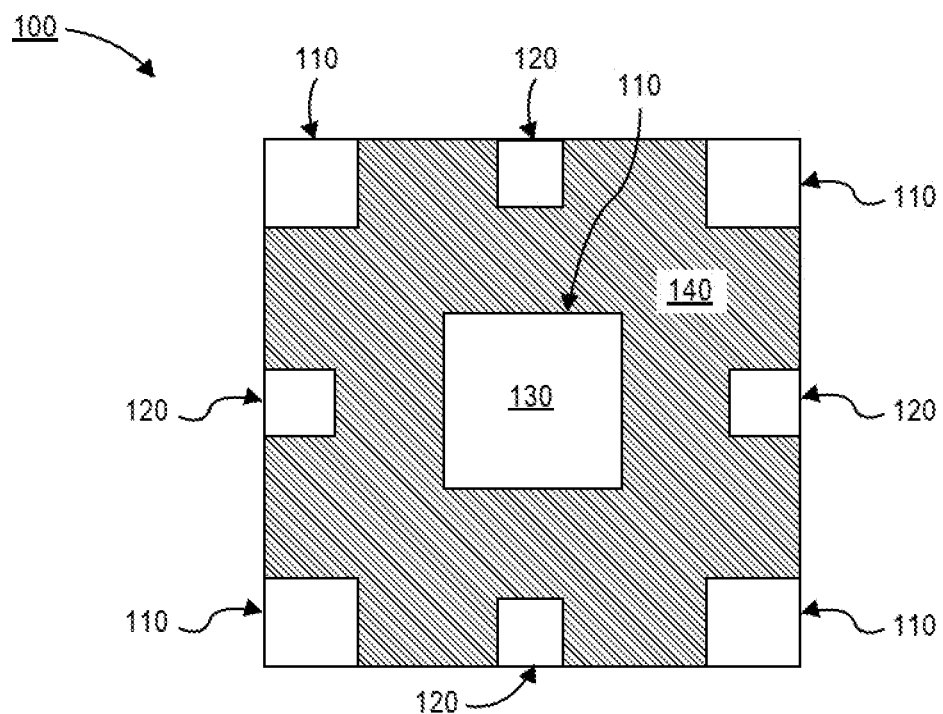
FIG. 1A is a plan view illustration of a reticle with a phase-shift layer over a mirror layer, in accordance with an embodiment.

Embodiments described herein comprise reticles with phase-shift layers and sub-resolution assist features (SRAFs) and methods of forming such reticles. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

As noted above, currently available EUV reticles do not provide the desired resolution and performance. Particularly, binary reticle architectures that include a patterned absorber layer over the multilayer mirror do not provide adequate resolution and suffer from poor contrast. Accordingly embodiments described herein include EUV reticles that comprise a phase-shift layer and sub-resolution assist features (SRAFs) patterned into the phase-shift layer. In such embodiments, feature edges may be printed by the cancellation of 0 and π-shifted EUV radiation. Such embodiments are particularly beneficial because, away from the feature edge, the EUV radiation waves constructively interfere. As such, the EUV intensity is also improved in accordance with embodiments described herein. Accordingly, embodiments described herein allow for improved lithography performance in image contrast/normalized image log-slope (NILS), and higher throughput for EUV scanners.

Referring now to FIG. 1A, a plan view illustration of a portion of a reticle 100 is shown, in accordance with an embodiment. In an embodiment, the reticle 100 may comprise a mirror layer 130 and a phase-shift layer 140 over the mirror layer 130. In an embodiment, the mirror layer 130 may comprise a plurality of alternating first and second mirror layers. The mirror layer 130 is tuned to reflect the EUV radiation (i.e., 13.5 nm). Common first and second mirror layers include molybdenum and silicon, but a plurality of other materials combinations can also be employed. In some embodiments, a capping layer (not shown) may be formed over the mirror layer 130. In an embodiment, the capping layer may be ruthenium. In an embodiment, the phase-shift layer 140 may have a refractive index (n) that is as far away from 1 as possible. For example, the phase-shift layer 140 may comprise one or more of Mo, MoSi, Nb, Zr, C, Ti, Tc, and alloys thereof.

In an embodiment, the portion of the reticle 100 that is shown is a portion with a high density of printable features 110 in a repeating unit cell. For example, a printable feature 110 is shown in the center of FIG. 1A and additional portions of printable features 110 are shown in the corners of FIG. 1A. As used herein a "printable" feature refers to a feature that is desired to be printed on a wafer during EUV lithography. In an embodiment, the printable features 110 may be defined by openings formed through the phase-shift layer 140. For example, in current EUV scanners, printable features may be greater than about 10 nm (in wafer dimensions, i.e., 4 times the size this on the mask). However, it is to be appreciated that as EUV lithography equipment advances the dimensions of "printable features" will also continue to decrease. For example, what may be considered a "non-printable feature" today, may, in the future, be a "printable feature".

In an embodiment, a plurality of non-printable features 120 may be formed proximate to the printable features 110. As used herein, "non-printable" features refer to features that will not print onto a wafer during EUV lithography. For example, in current EUV scanners, "non-printable" features may be less than about 16 nm (in wafer dimensions, i.e., 4 times the size on this on the mask). It is to be appreciated that there may be some overlap between "printable" and "non-printable" dimensions as the printability may depend on many particulars of the lithography process, photoresist, etc. Furthermore, it is to be appreciated that as EUV lithography equipment advances the dimensions of "non-printable features" will also continue to decrease. While not printed as distinct features on the wafer, it is to be appreciated that the non-printable features 120 may contribute to the printing of the printable features 110. For example, the non-printable features 120 may be sub-resolution assist features (SRAFs) that improve the contrast and resolution of the printed features. In an embodiment, the non-printable features 120 may have a dimension that is less than a dimension of the printable features. For example, in FIG. 1A the non-printable features 120 may have an edge length that is one-quarter the edge length of the printable features 110 or smaller.

In an embodiment, the printable features 110 may be replicated on a wafer using EUV lithography. Particularly, embodiments may allow for replication of the printable features 110 without the need for absorber material proximate to the printable features 110 (i.e., while there may be absorber material in other regions of the reticle 100, there may be no need for absorber material proximate to the printable features). Instead, the contrast between printed features and non-printed features is obtained by shifting the phase of incoming radiation at certain locations with the phase-shift layer 140. Additionally, the presence of non-printable features 120 (i.e., SRAFs) helps improve the contrast and resolution of the printable features 110. For example, the presence of unwanted side lobes of the printable features 110 may be suppressed by the presence of non-printable features 120.

Figure 1B:
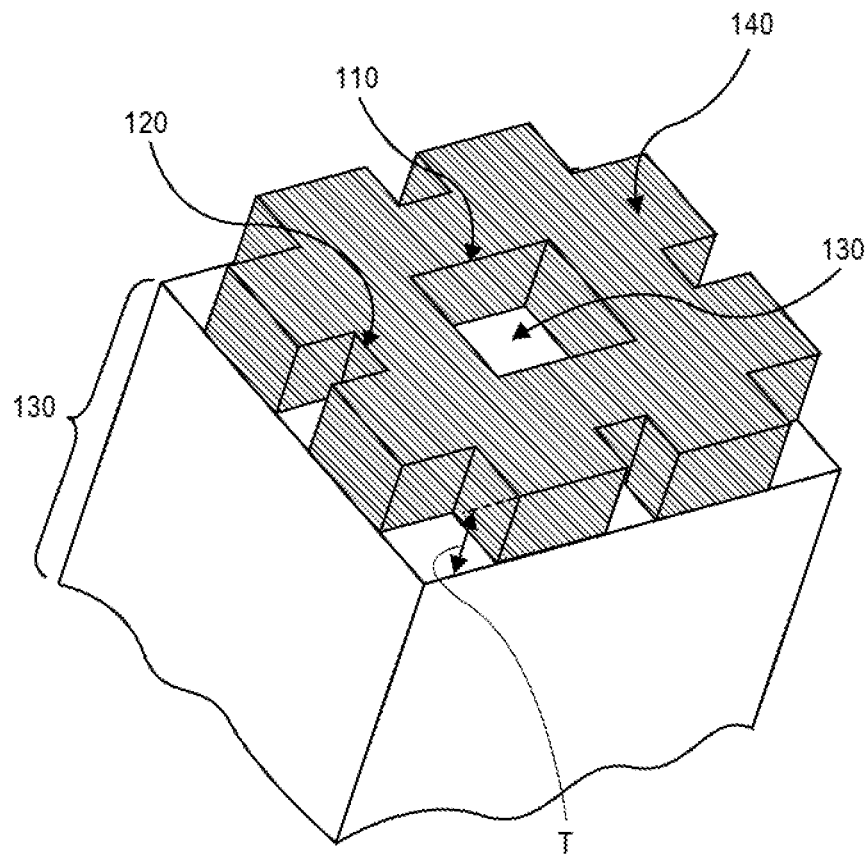
FIG. 1B is a perspective view illustration of a portion of the reticle in FIG. 1A, in accordance with an embodiment.

Referring now to FIG. 1B, a perspective view illustration of a portion of the reticle 100 is shown, in accordance with an embodiment. As shown, the phase-shift layer 140 may be formed over the mirror layer 130 that comprises a plurality of alternating first and second mirror layers. In an embodiment the phase-shift layer 140 may have a thickness T that is suitable for providing the desired phase shift. For example, the thickness T may be in the range of approximately 30 nm to 90 nm, depending on the refractive index of the material chosen for the phase-shift layer 140. As shown in FIG. 1B, openings through the phase-shift layer 140 define printable features 110 and non-printable features 120 on the surface of the mirror layer 130.

Figure 2:
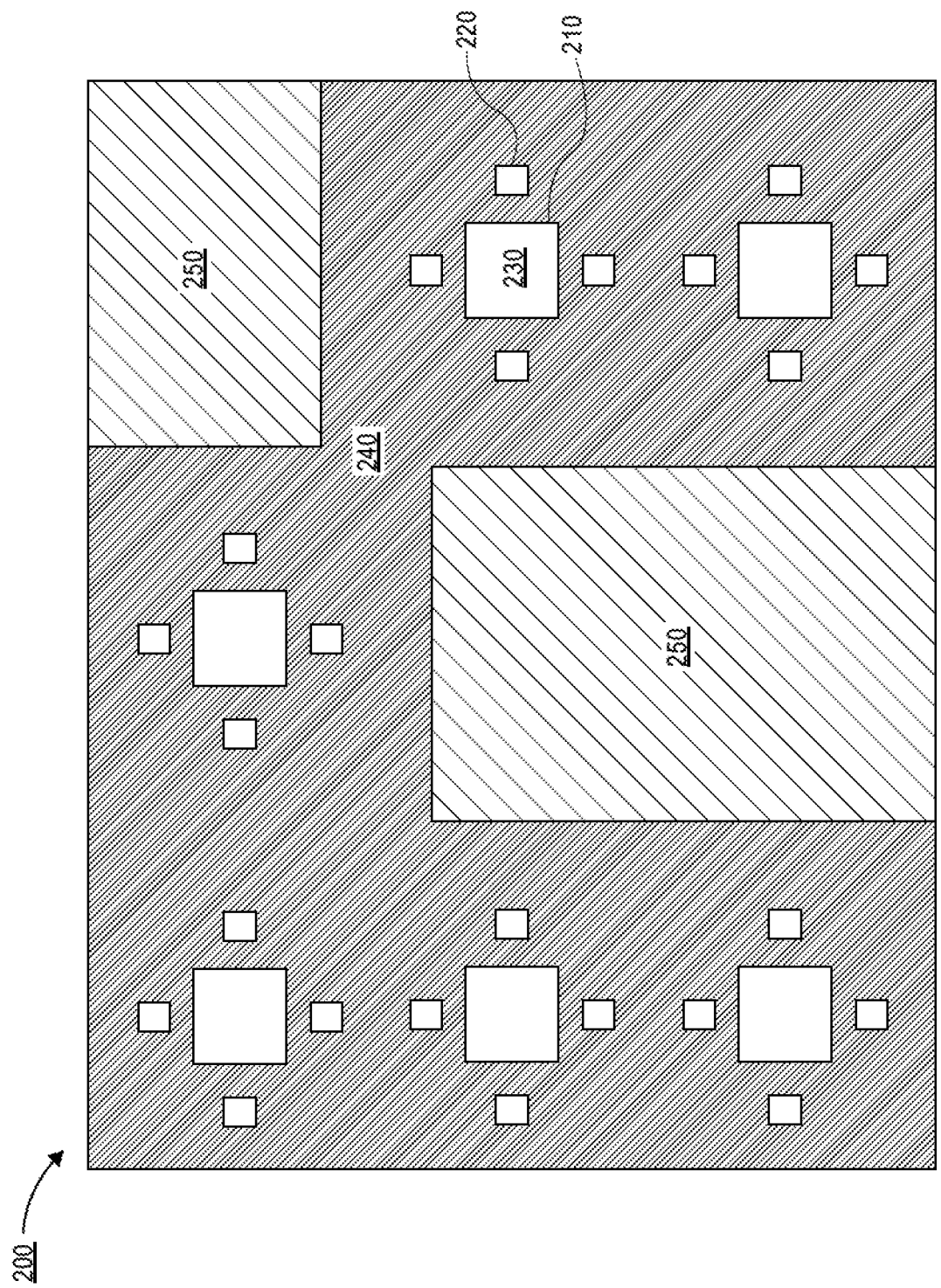
FIG. 2 is a plan view illustration of a reticle with a phase-shift layer with a plurality of printable features and sub-resolution assist features (SRAFs), in accordance with an embodiment.

Referring now to FIG. 2, a plan view illustration of a larger portion of a reticle 200 is shown, in accordance with an embodiment. As shown, the printable features 210 may not have a uniformly dense pattern across the reticle 200. As such, regions with a low density of printable features 210 may be covered by an absorber layer 250 formed over the mirror layer 230. In an embodiment, the absorber layer 250 may comprise tantalum nitride, tantalum boron nitride, or any other suitable material that absorbs the EUV radiation. It is to be appreciated that the absorber layer 250 does not need to be proximate to the printable features 210 since the phase-shift layer 240 and non-printable features 220 provide the constructive and destructive interference necessary for printing the desired features. Furthermore, while each printable feature 210 is shown as a box (e.g., for printing via openings), it is to be appreciated that not all printable features 210 on the reticle 200 need to have the same shape and/or dimensions.

Figure 3A:
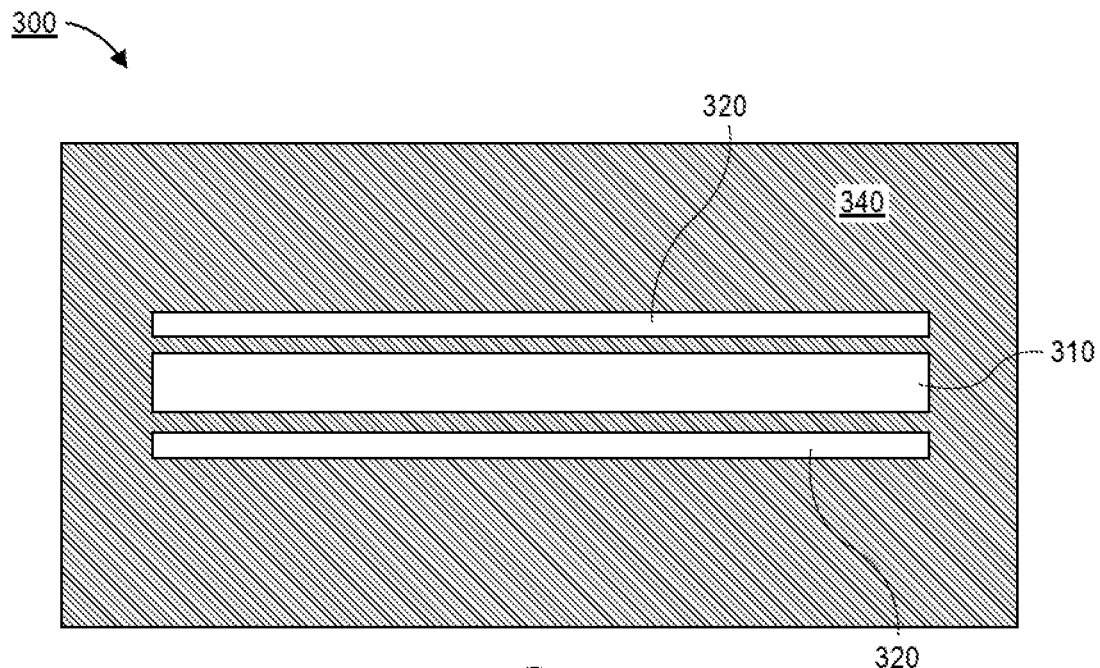
FIG. 3A is a plan view illustration of a reticle with a phase-shift layer and a two dimensional printable feature and SRAFs, in accordance with an embodiment.
Figure 3B:
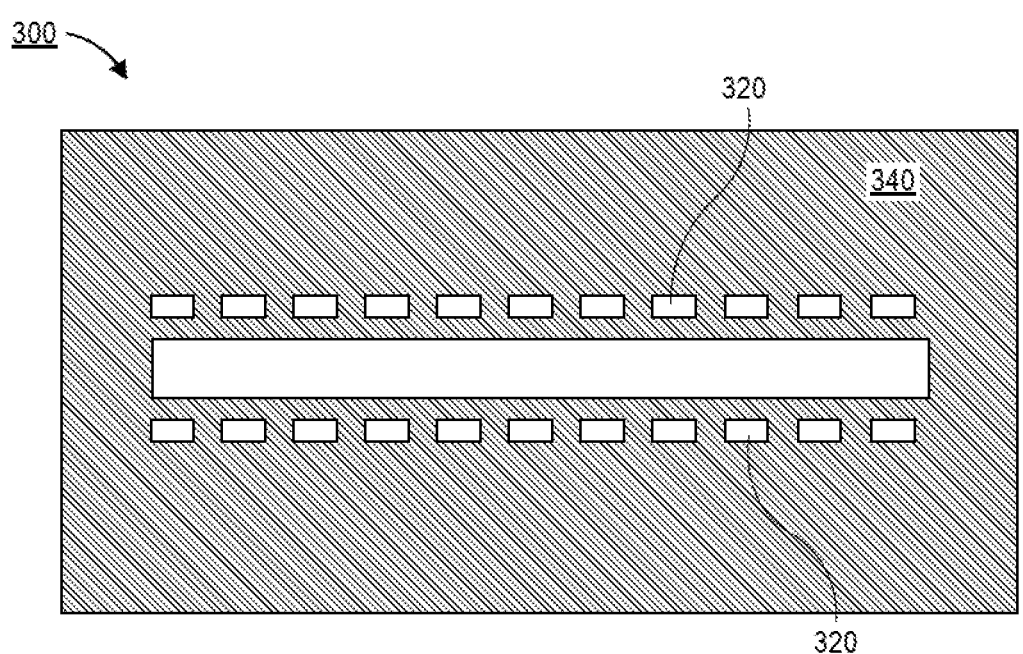
FIG. 3B is a plan view illustration of a reticle with a phase-shift layer and a two dimensional printable feature and SRAFs, in accordance with an additional embodiment.

Referring now to FIG. 3A and FIG. 3B, plan view illustrations of reticles 300 with printable features 310 with alternative shapes are shown, in accordance with embodiments. In an embodiment, the printable features 310 may be two-dimensional traces. For example, two-dimensional printable features 310 may be used to define fins, gates, traces, or other features on the wafer. In an embodiment, non-printable features 320 may be formed proximate to two-dimensional printable features 310. In the embodiment illustrated in FIG. 3A, the non-printable features 320 may comprise longitudinal openings (i.e., lines) that are formed parallel to the printable features 310. In the embodiment illustrated in FIG. 3B, a plurality of non-printable features 320 may be formed proximate to the printable features 310. While two examples of non-printable features 320 are shown in FIGS. 3A and 3B, it is to be appreciated that non-printable features 320 may comprise any suitable SRAF that will improve the printability of the printable features 310.

Figure 4A:
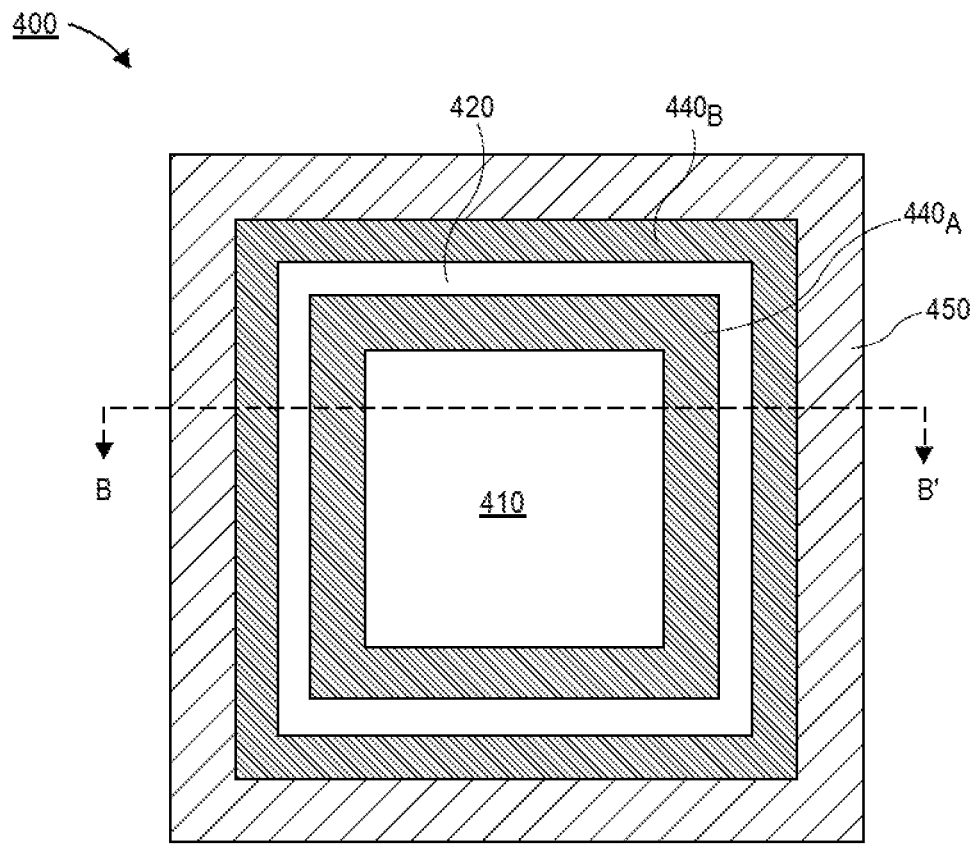
FIG. 4A is a plan view illustration of a reticle with a phase-shift layer and an SRAF surrounding a printable feature, in accordance with an embodiment.
Figure 4B:
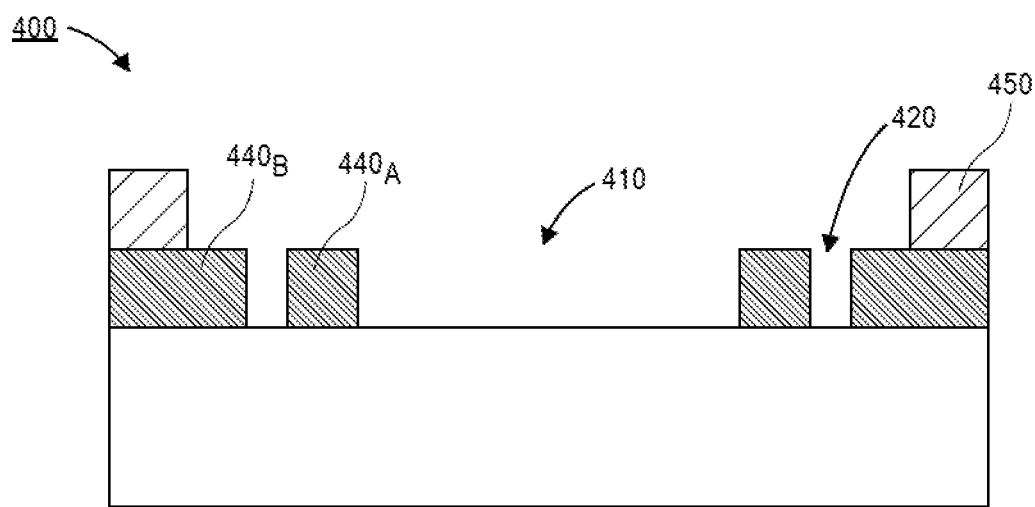
FIG. 4B is a cross-sectional illustration of the reticle in FIG. 4A, in accordance with an embodiment.

Referring now to FIGS. 4A and 4B, a plan view illustration and corresponding cross-sectional illustration along line B-B' of a portion of a reticle 400 are shown, in accordance with an additional embodiment. In an embodiment, the reticle 400 may comprise a mirror layer 430. The mirror layer 430 may comprise a plurality of alternating first and second mirror layers (e.g., alternating layers of molybdenum and silicon). In an embodiment, a phase-shift layer 440 may be formed over the mirror layer 430. In an embodiment, the phase-shift layer 440 may comprise one or more of Mo, MoSi, Nb, Zr, C, Ti, Tc, V, W, Re, Rh, Ru and alloys thereof. In an embodiment, the phase-shift layer 440 may comprise a first opening and a second opening surrounding a perimeter of the first opening. In an embodiment, the first opening may be an opening for a printable feature 410 and the second opening may be for a non-printable feature 420. In an embodiment, the printable feature 410 may be surrounded by a first portion 440A of the phase-shift layer and the non-printable feature 420 may be surrounded by a second portion 440B of the phase-shift layer. In an embodiment, an absorber layer 450 may be formed over the phase-shift layer 440. In a particular embodiment, the absorber layer 450 may surround an outer perimeter of the non-printable feature 420. In an embodiment, the absorber layer 450 may comprise tantalum nitride, tantalum boron nitride, or any other suitable material that absorbs the EUV radiation Referring now to FIGS. 5A-5E a series of cross-sectional illustrations that illustrate a process for forming a reticle is shown, in accordance with an embodiment.

Figure 5A:
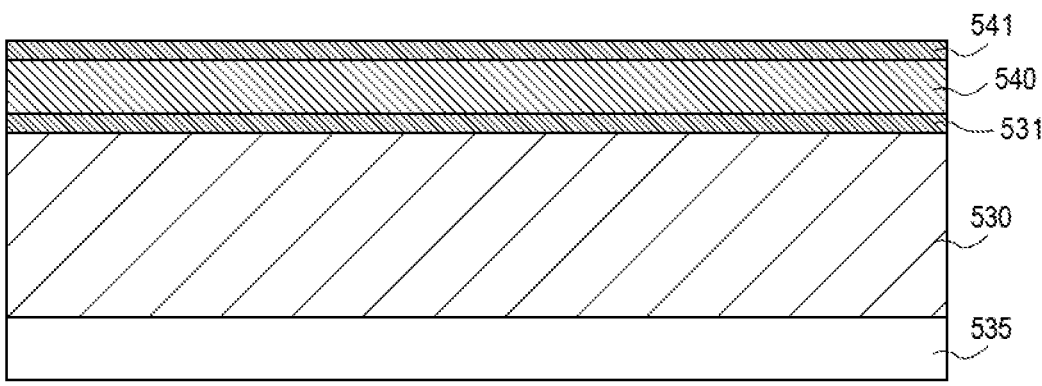
FIG. 5A is a cross-sectional illustration of a reticle with a phase-shift layer over the mirror layer, in accordance with an embodiment.

Referring now to FIG. 5A, a cross-sectional illustration of a reticle blank is shown, in accordance with an embodiment. In an embodiment, the reticle blank may comprise a substrate 535. In an embodiment, the substrate 535 may be a material with a low coefficient of thermal expansion. For example, the substrate 535 may be quartz or the like. In an embodiment, a mirror layer 530 may be formed over the substrate 535. The mirror layer 530 may comprise a plurality of alternating first mirror layers and second mirror layers (e.g., molybdenum and silicon). In an embodiment, an etchstop layer 531 may be formed over the mirror layer 530. In some embodiments, the etchstop layer 531 may be referred to as a capping layer. For example, the etchstop layer 531 may be ruthenium or the like. In other embodiments, the etchstop layer 531 may be formed over a capping layer (not shown).

In an embodiment, a phase-shift layer 540 may be formed over the etchstop layer 531. The phase-shift layer 540 may be a material that has an etch selectivity relative to the etchstop layer 531. In an embodiment, the phase-shift layer 540 may be a material that has a refractive index (n) that is far from 1. For example, the phase-shift layer 540 may be one or more of Mo, MoSi, Nb, Zr, C, Ti, Tc, V, W, Re, Rh, Ru and alloys thereof. In an embodiment, a hardmask layer 541 may be formed over the phase-shift layer 540. In some embodiments, the hardmask layer 541 may be the same material as the etchstop layer 531. In other embodiments, the hardmask layer 541 may be any material that is etch selective to the phase-shift layer 540.

Figure 5B:
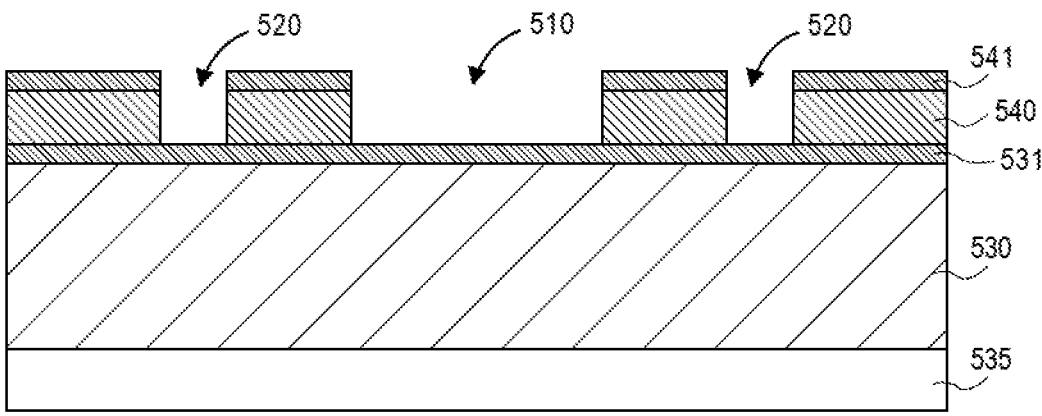
FIG. 5B is a cross-sectional illustration of the reticle after SRAFs and printable features are patterned into the phase-shift layer, in accordance with an embodiment.

Referring now to FIG. 5B, a cross-sectional illustration after the phase-shift layer 540 is patterned is shown, in accordance with an embodiment. In an embodiment, the phase-shift layer 540 and the hardmask layer 541 may be patterned with one or more etching processes that use a resist layer (not shown) as a mask. In an embodiment, the pattern may comprise openings for non-printable features 520 and for printable features 510.

Figure 5C:
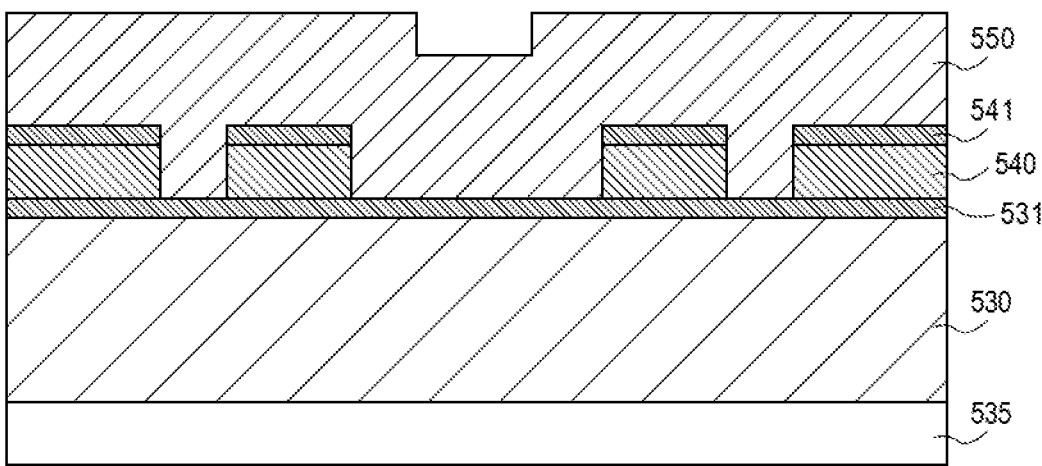
FIG. 5C is a cross-sectional illustration of the reticle after an absorber layer is disposed over the phase-shift layer, in accordance with an embodiment.
Figure 5D:
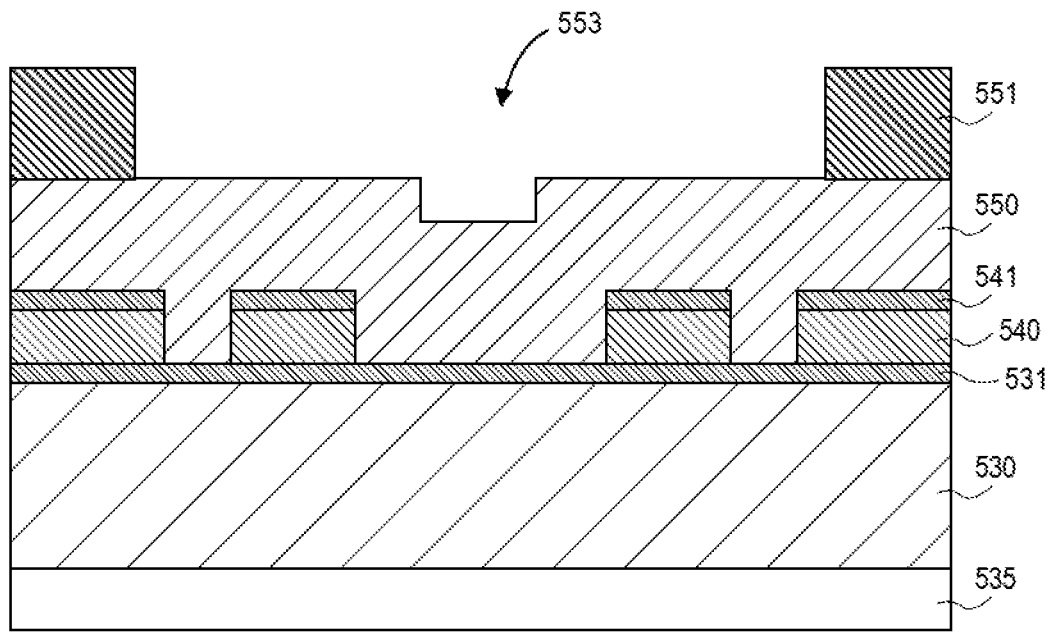
FIG. 5D is a cross-sectional illustration of the reticle after a resist layer is formed and patterned, in accordance with an embodiment.

Referring now to FIG. 5C, a cross-sectional illustration after an absorber layer 550 is disposed over the phase-shift layer 540 is shown, in accordance with an embodiment. In an embodiment, the absorber layer 550 may be disposed with a blanket deposition process. For example, the absorber layer 550 may fill the openings for the non-printable features 520 and the printable features 510 in addition to being formed over a top surface of the hardmask layer 541. In an embodiment, the absorber layer 550 may comprise tantalum nitride, tantalum boron nitride, or any other suitable material that absorbs the EUV radiation Referring now to FIG. 5D, a cross-sectional illustration after a mask layer 551 is disposed over the absorber layer 550 and patterned is shown, in accordance with an embodiment. In an embodiment, the mask layer 551 may be a photoresist material that is exposed with actinic radiation and developed to form an opening 553 over the printable features 510 and the non-printable features 520.

Figure 5E:
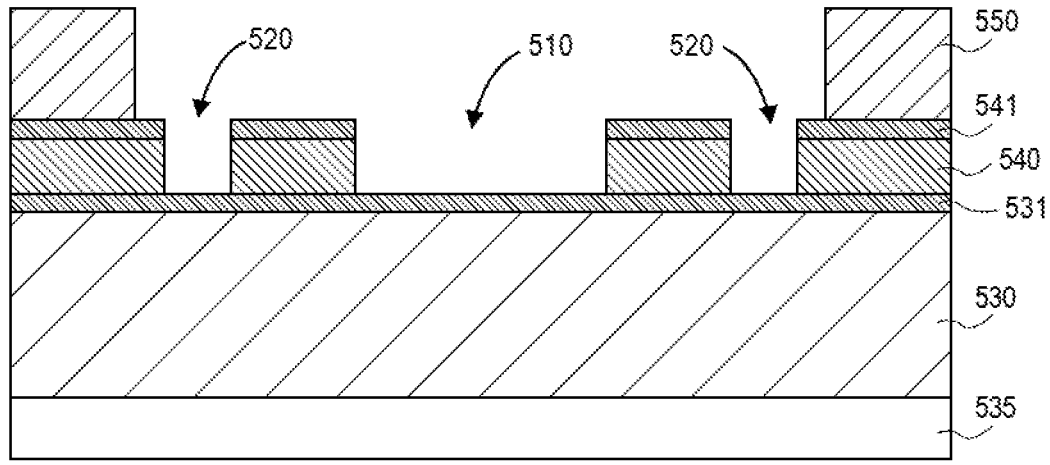
FIG. 5E is a cross-sectional illustration of the reticle after the absorber layer is patterned, in accordance with an embodiment.

Referring now to FIG. 5E, a cross-sectional illustration after the opening 553 is transferred to the absorber layer 550 is shown, in accordance with an embodiment. In an embodiment, the absorber layer 550 may be removed from above non-printable features 520 and the printable features 510. Accordingly, the absorber layer 550 may not be formed proximate to the printable features 510. Instead, the printable features 510 may have printed edges defined by the use of constructive and destructive interference attributable to the phase-shift layer 540 and the non-printable features 520.

Referring now to FIGS. 6A-6H, a series of cross-sectional illustrations that illustrate a process for forming a reticle is shown, in accordance with an additional embodiment.

Figure 6A:
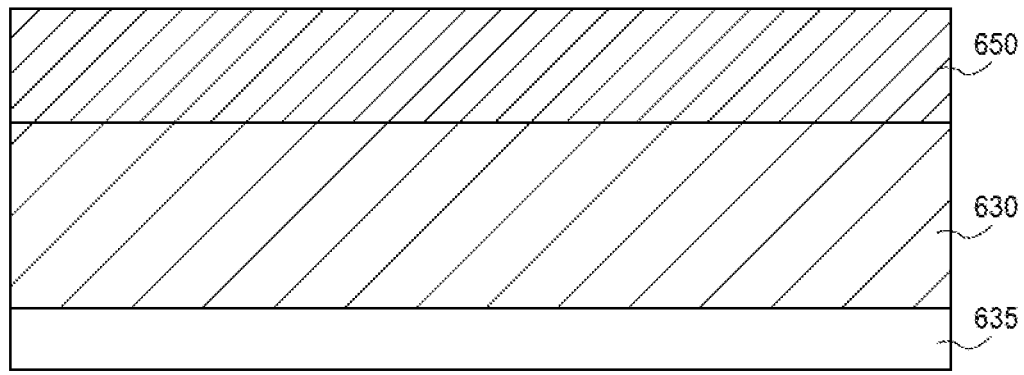
FIG. 6A is a cross-sectional illustration of a reticle with an absorber layer disposed over a mirror layer, in accordance with an embodiment.

Referring now to FIG. 6A, a cross-sectional illustration of a reticle blank is shown, in accordance with an embodiment. In an embodiment, the reticle blank may comprise a substrate 635. In an embodiment, the substrate 635 may be a material that has a low thermal expansion coefficient. For example, the substrate 635 may be quartz or the like. In an embodiment, a mirror layer 630 may be formed over the substrate 635. The mirror layer 630 may comprise a plurality of alternating first mirror layers and second mirror layers (e.g., molybdenum and silicon). In the illustrated embodiment, there is no capping layer shown over the mirror layer 630. However, in some embodiments a capping layer (e.g., ruthenium) may be formed over the mirror layer 630. In an embodiment, an absorber layer 650 may be formed over a top surface of the mirror layer 630. In an embodiment, the absorber layer 650 may comprise tantalum nitride, tantalum boron nitride, or any other suitable material that absorbs the EUV radiation.

Figure 6B:
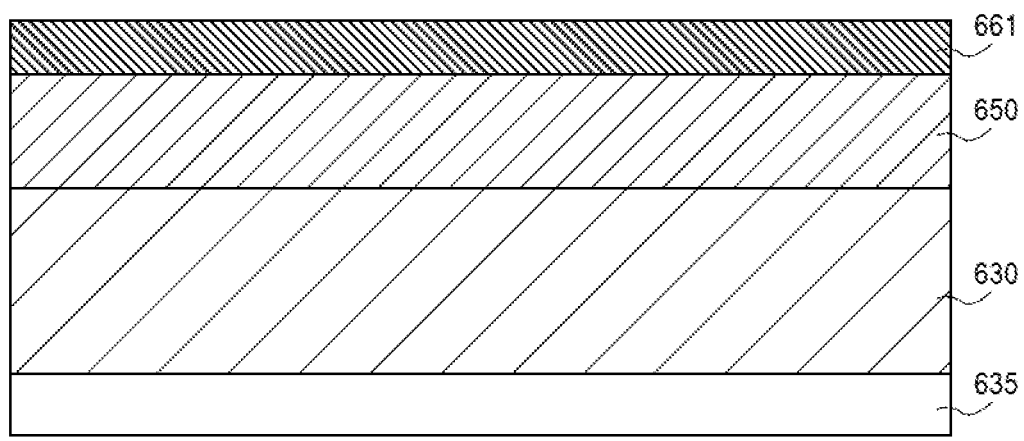
FIG. 6B is a cross-sectional illustration of the reticle after a polishing stop layer is disposed over the absorber layer, in accordance with an embodiment.

Referring now to FIG. 6B, a cross-sectional illustration after a polishing stop layer 661 is formed over the absorber layer 650 is shown, in accordance with an embodiment. In an embodiment, the polishing stop layer 661 may be a material that is resistant to a polishing process used in a subsequent processing operation. For example, the polishing stop layer 661 may be a silicon oxide, or the like.

Figure 6C:
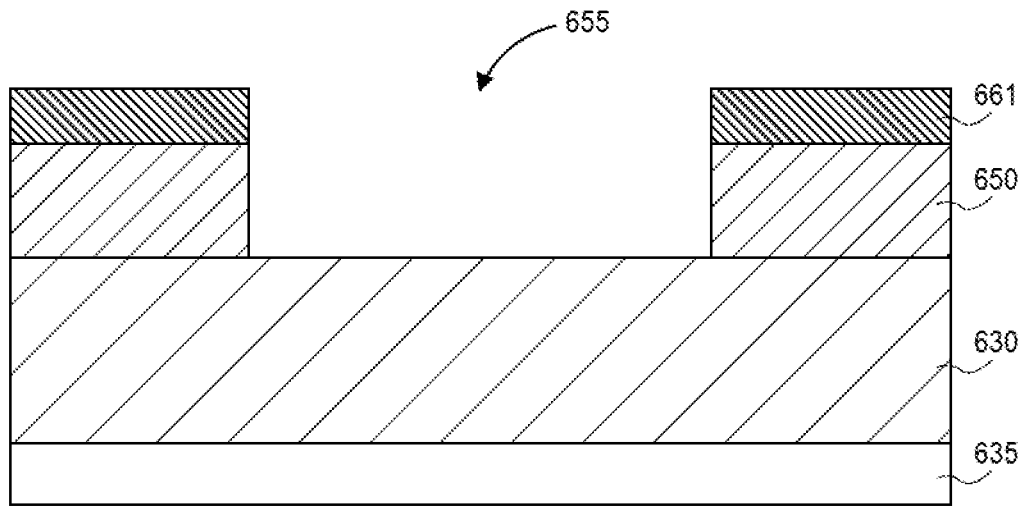
FIG. 6C is a cross-sectional illustration of the reticle after a first opening is formed through the polishing stop layer and the absorber layer, in accordance with an embodiment.

Referring now to FIG. 6C, a cross-sectional illustration after a first opening 655 is formed through the polishing stop layer 661 and the absorber layer 650 is shown, in accordance with an embodiment. In an embodiment, the first opening may be formed with one or more etching processes that utilizes a resist layer (not shown) as a mask. In an embodiment, the first opening 655 exposes the mirror layer 630 (or a capping layer (not shown) formed over the mirror layer 630).

Figure 6D:
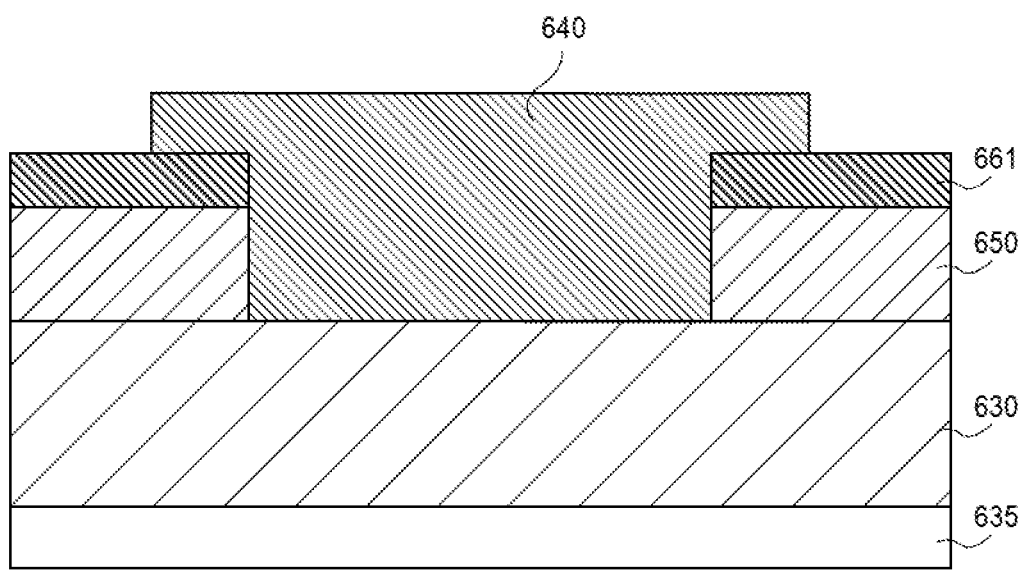
FIG. 6D is a cross-sectional illustration of the reticle after a phase-shift layer is disposed in the first opening, in accordance with an embodiment.

Referring now to FIG. 6D, a cross-sectional illustration after a phase-shift layer 640 is disposed in the first opening 655 is shown, in accordance with an embodiment. In an embodiment, the phase-shift layer 640 may comprise one or more of Mo, MoSi, Nb, Zr, C, Ti, Tc, and alloys thereof. In an embodiment, the phase-shift layer 640 may be disposed so that it completely fills the first opening 655 and forms overburden over the polishing stop layer 661.

Figure 6E:
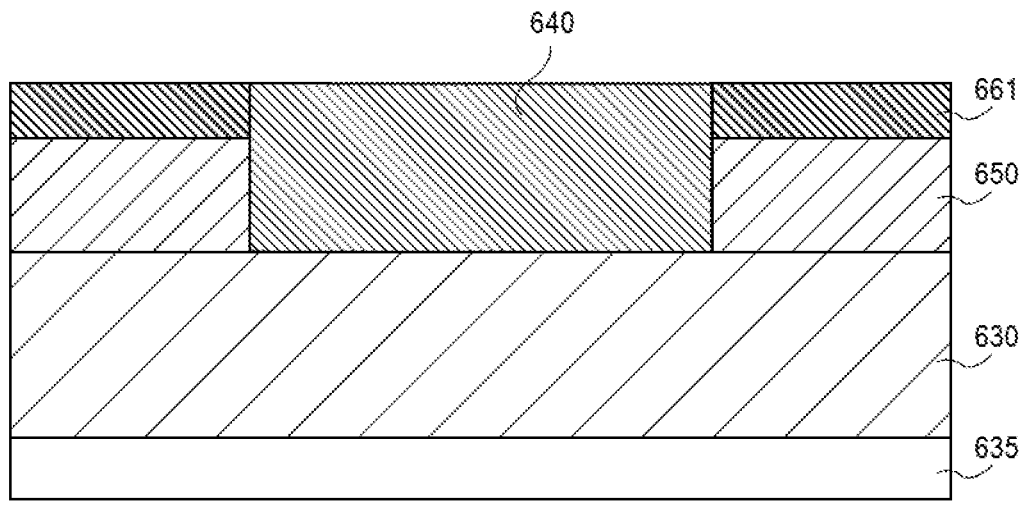
FIG. 6E is a cross-sectional illustration of the reticle after the phase-shift layer is polished to be substantially coplanar with a surface of the polishing stop layer, in accordance with an embodiment.

Referring now to FIG. 6E, a cross-sectional illustration after the phase-shift layer 640 is polished is shown, in accordance with an embodiment. In an embodiment, the phase-shift layer 640 may be polished (e.g., with a chemical mechanical polishing (CMP) process) so that a top surface of the phase-shift layer 640 is substantially coplanar with a top surface of the polishing stop layer 661.

Since the phase-shift layer 640 is polished, the tope surface of the phase-shift layer 640 is flatter than would be possible with only an etched phase-shift layer. Furthermore, the thickness of the phase-shift layer 640 may be precisely controlled by using the polishing stop layer 661 as an endpoint to the polishing process. Additionally, since the phase-shift layer 640 is polished instead of etched, the material composition of the phase-shift layer 640 may be changed without also needing to change an etching chemistry.

Figure 6F:
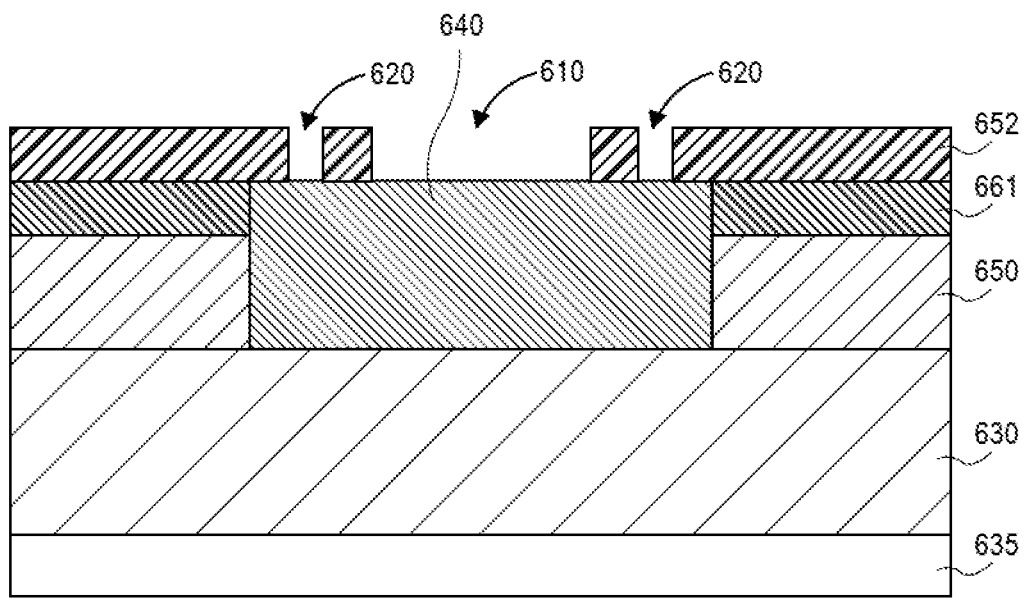
FIG. 6F is a cross-sectional illustration of the reticle after a resist layer is disposed over the phase-shift layer and patterned, in accordance with an embodiment.

Referring now to FIG. 6F, a cross-sectional illustration after a resist layer 652 is disposed and patterned is shown, in accordance with an embodiment. In an embodiment, the resist layer 652 may be any suitable photoresist material that is exposed with actinic radiation. In an embodiment, the resist layer 652 may be patterned with openings for printable features 610 and non-printable features 620. In an embodiment, the openings for the printable features 610 and the non-printable features 620 may be positioned over the phase-shift layer 640.

Figure 6G:
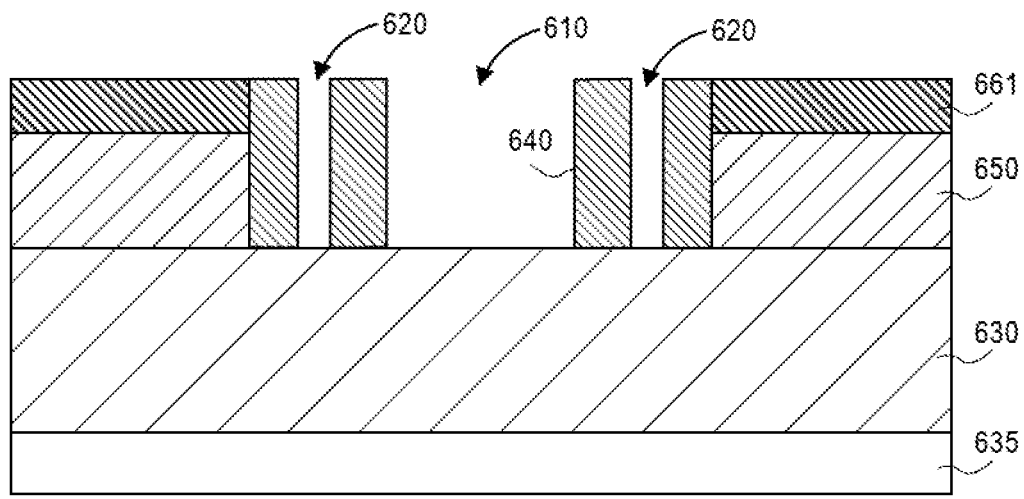
FIG. 6G is a cross-sectional illustration of the reticle after the phase-shift layer is patterned, in accordance with an embodiment.

Referring now to FIG. 6G, a cross-sectional illustration after the phase-shift layer 640 is patterned is shown, in accordance with an embodiment. In an embodiment, the pattern of the resist layer 652 may be transferred into the phase-shift layer 640 with an etching process. After the phase-shift layer 640 is patterned, the resist layer may be removed.

Figure 6H:
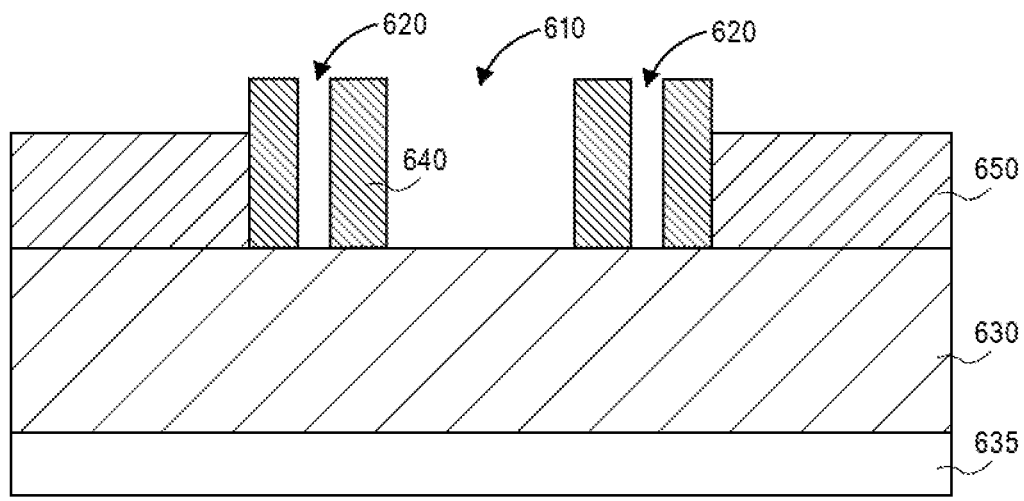
FIG. 6H is a cross-sectional illustration of the reticle after the polishing stop layer is removed, in accordance with an embodiment.

Referring now to FIG. 6H, a cross-sectional illustration after the polishing stop layer 661 is removed is shown, in accordance with an embodiment. In an embodiment, the polishing stop layer 661 may be removed with an etching process. As shown in FIG. 6H, the top surfaces of the phase-shift layer 640 may be above the top surface of the absorber layer 650. Furthermore, the absorber layer 650 may contact sidewall surfaces of the phase-shift layer 640. That is, the absorber layer 650 and the phase-shift layer may both be formed over the mirror layer 630 and arranged in a side-by-side configuration as opposed to a stacked configuration.

Referring now to FIGS. 7A-7D, a series of cross-sectional illustrations that show a process for forming a self-aligned absorber layer is shown, in accordance with an embodiment.

Figure 7A:
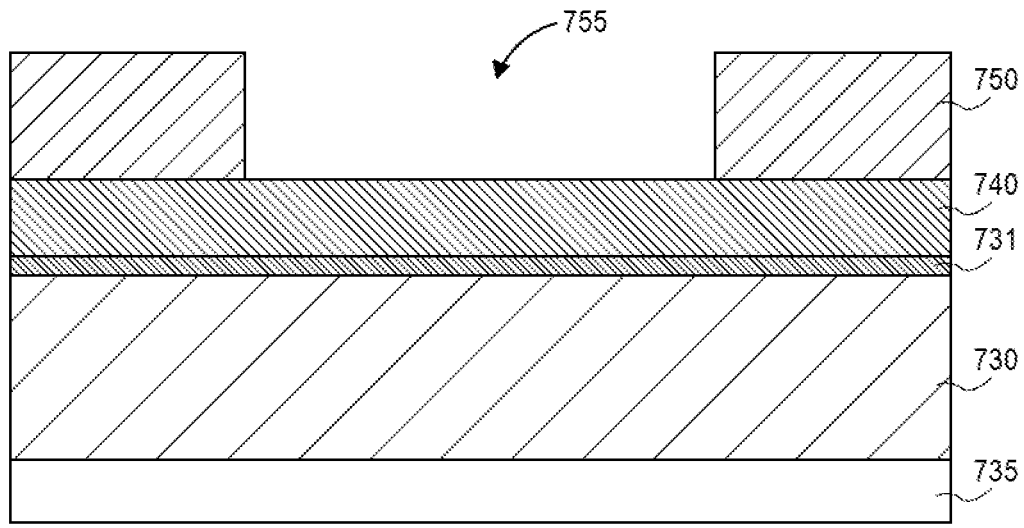
FIG. 7A is a cross-sectional illustration of a reticle with a patterned absorber layer disposed over a phase-shift layer, in accordance with an embodiment.

Referring now to FIG. 7A, a cross-sectional illustration of a reticle is shown, in accordance with an embodiment. In an embodiment, the reticle may comprise a substrate 735. In an embodiment, the substrate 735 may be quartz or another low thermal expansion coefficient material. In an embodiment, a mirror layer 730 may be formed over the substrate 735. The mirror layer 730 may comprise a plurality of alternating first mirror layers and second mirror layers (e.g., molybdenum and silicon). In an embodiment, an etchstop layer 731 may be formed over the mirror layer 730. In some embodiments, the etchstop layer 731 may be referred to as a capping layer. For example, the etchstop layer 731 may be ruthenium or the like. In other embodiments, the etchstop layer 731 may be formed over a capping layer (not shown). In an embodiment, a phase-shift layer 740 may be formed over the etchstop layer 731. In an embodiment, the phase-shift layer 740 may comprise one or more of Mo, MoSi, Nb, Zr, C, Ti, Tc, and alloys thereof.

In an embodiment, an absorber layer 750 may be formed over a top surface of the phase-shift layer 740. In an embodiment, the absorber layer 750 may comprise tantalum nitride, tantalum boron nitride, or any other suitable material that absorbs the EUV radiation. In an embodiment, a first opening 755 may be formed through the absorber layer 750. For example, the first opening 755 may be formed with a lithography process.

Figure 7B:
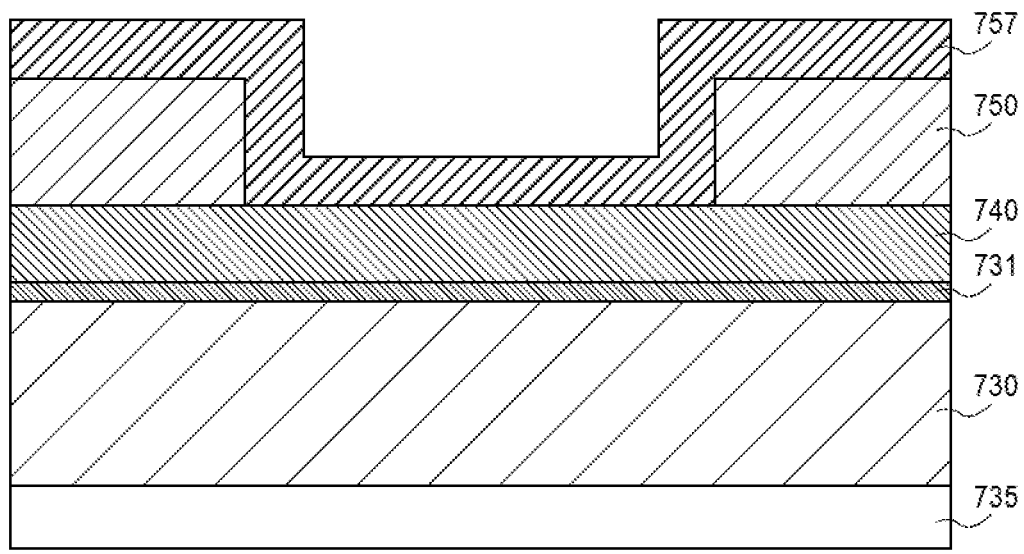
FIG. 7B is a cross-sectional illustration of the reticle after a spacer layer is disposed over the absorber layer, in accordance with an embodiment.

Referring now to FIG. 7B, a cross-sectional illustration after a spacer layer 757 is formed over the exposed surfaces of the absorber layer 750 and the exposed surface of the phase-shift layer 740 is shown, in accordance with an embodiment. In an embodiment, the spacer layer 757 may be disposed with a conformal deposition process. As such, the spacer layer 757 may have a substantially uniform thickness over planar surfaces and non-planar surfaces (i.e., the sidewalls of the absorber layer 750).

Figure 7C:
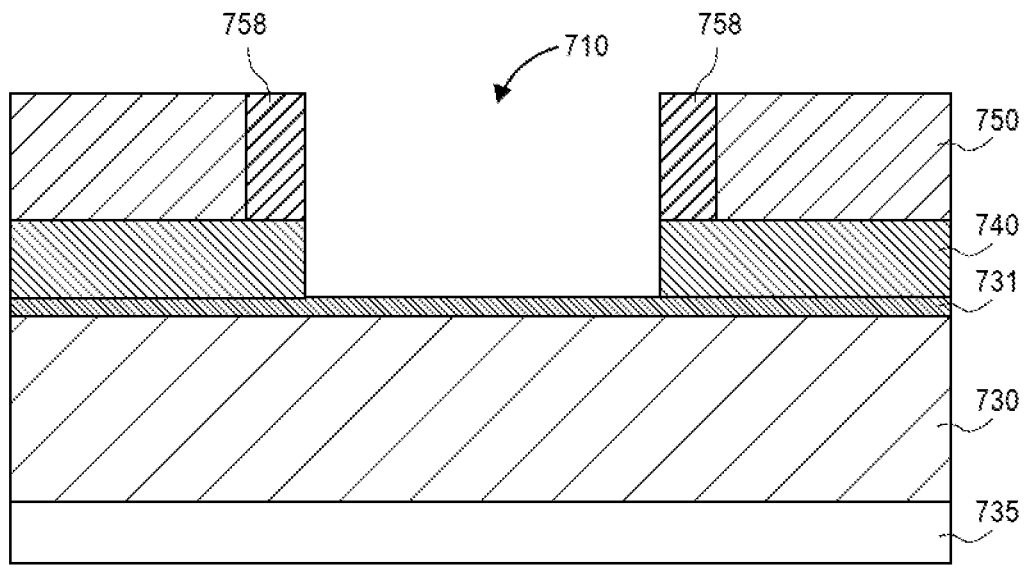
FIG. 7C is a cross-sectional illustration of the reticle after the spacer layer is patterned and the pattern is used to etch the phase-shift layer, in accordance with an embodiment.

Referring now to FIG. 7C, a cross-sectional illustration after a spacer etch is implemented to form sidewall spacers 758 is shown, in accordance with an embodiment. In an embodiment, the spacer etch may comprise an etching process that preferentially etches the spacer layer 757 along planar surfaces. Accordingly, spacers 758 along the sidewalls of the absorber layer 750 may remain. After the formation of the spacers 758, embodiments may include using the absorber layer 750 and the spacers 758 as an etching mask to etch through the exposed portions of the phase-shift layer 740 to form an opening for a printable feature 710.

Figure 7D:
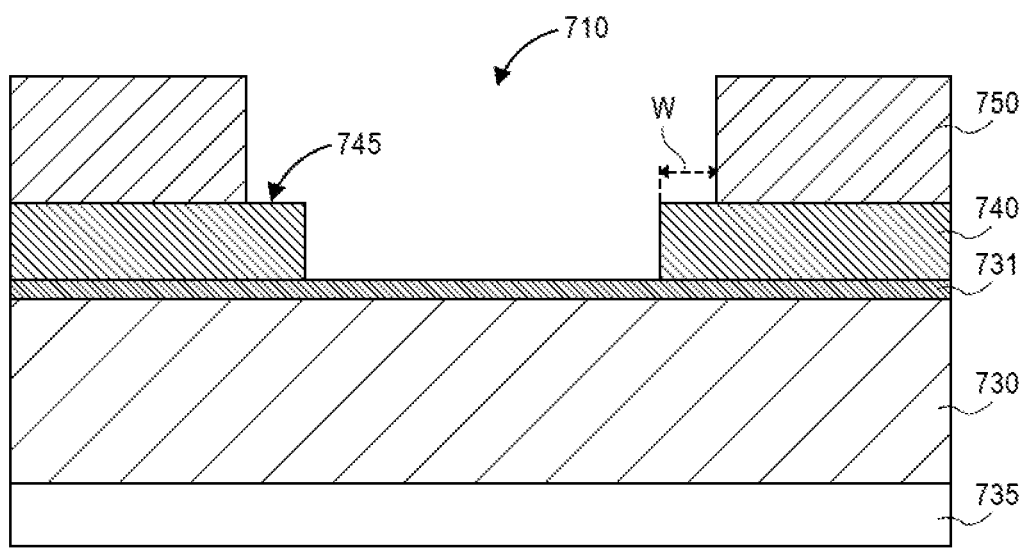
FIG. 7D is a cross-sectional illustration of the reticle after the spacer layer is removed, in accordance with an embodiment.

Referring now to FIG. 7D, a cross-sectional illustration after the spacers 758 are removed is shown, in accordance with an embodiment. In an embodiment, the removal of the spacers 758 produces and exposed surface 745 of the phase-shift layer 740. In an embodiment, the width W of the exposed surface 745 matches the width of the spacer 758. Accordingly, the exposed surface 745 may be referred to as a self-aligned feature since the width W is dependent on the width of the spacer 758 instead of a patterning process that has inherent overlay error.

Figure 8A:
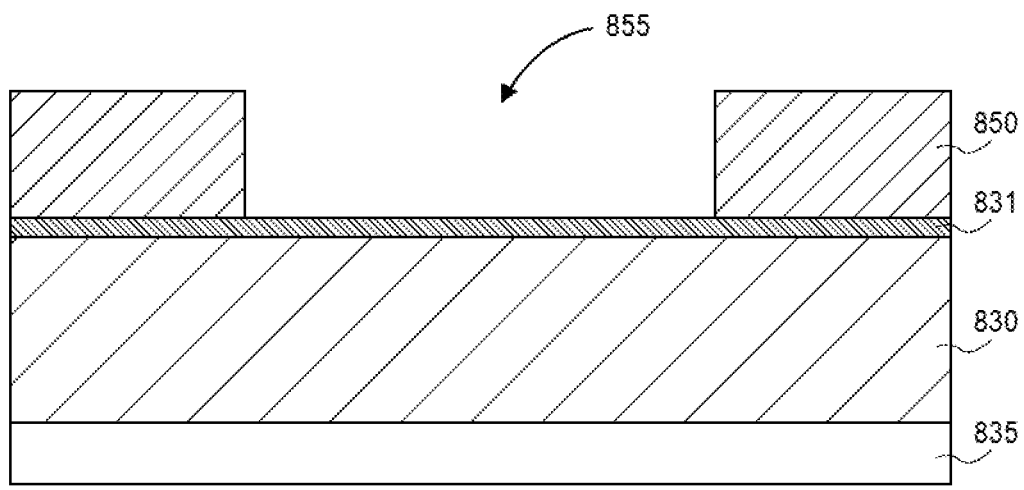
FIG. 8A is a cross-sectional illustration of a reticle with a patterned absorber layer disposed over a mirror layer, in accordance with an embodiment.
Figure 8B:
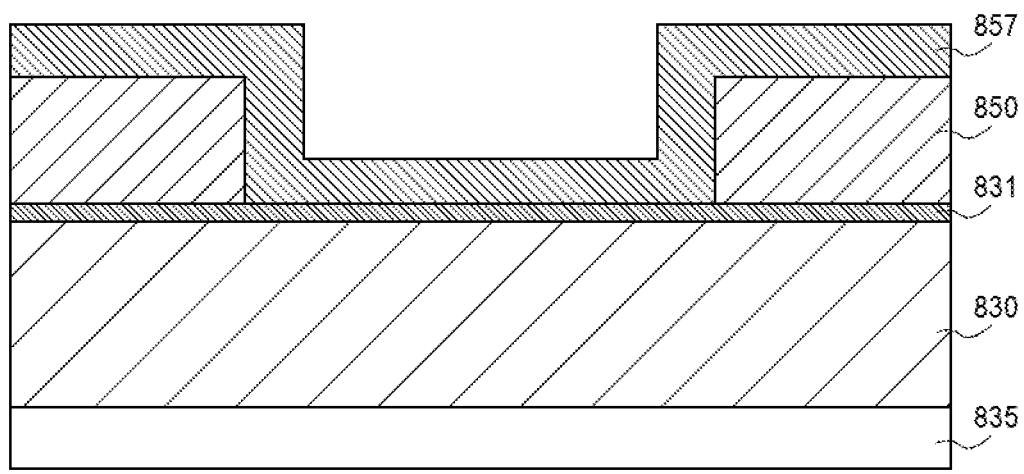
FIG. 8B is a cross-sectional illustration of the reticle after a spacer layer is formed over the absorber layer, in accordance with an embodiment.
Figure 8C:
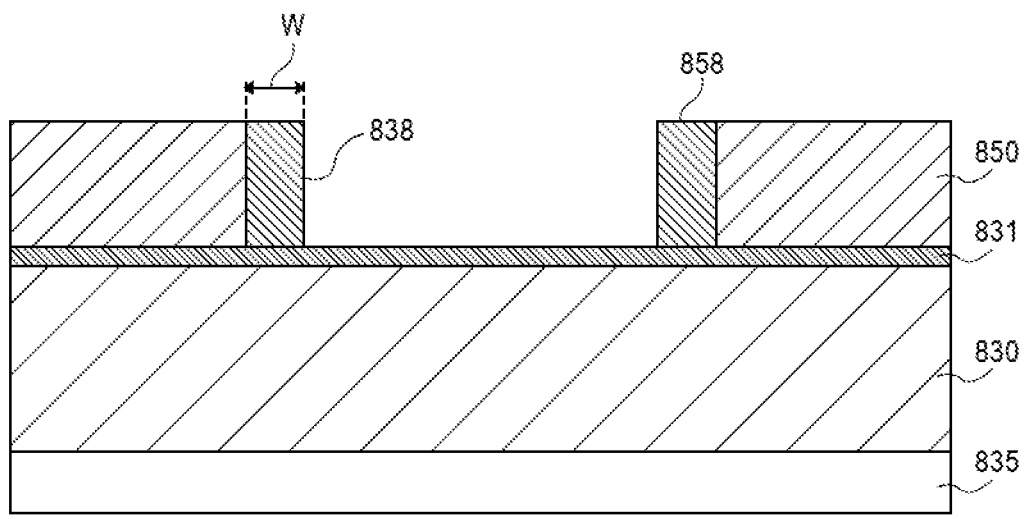
FIG. 8C is a cross-sectional illustration of the reticle after the spacer layer is etched to form a phase-shift spacer, in accordance with an embodiment.

Referring now to FIGS. 8A-8C, a series of cross-sectional illustrations that illustrate a process for forming a reticle with a self-aligned phase-shift layer is shown, in accordance with an embodiment.

Referring now to FIG. 8A, a cross-sectional illustration of a reticle is shown, in accordance with an embodiment. In an embodiment, the reticle may comprise a substrate 835. In an embodiment, the substrate 835 may be quartz or another low thermal expansion coefficient material. In an embodiment, a mirror layer 830 may be formed over the substrate 835. The mirror layer 830 may comprise a plurality of alternating first mirror layers and second mirror layers (e.g., molybdenum and silicon). In an embodiment, an etchstop layer 831 may be formed over the mirror layer 830. In some embodiments, the etchstop layer 831 may be referred to as a capping layer. For example, the etchstop layer 831 may be ruthenium or the like. In other embodiments, the etchstop layer 831 may be formed over a capping layer (not shown).

In an embodiment, an absorber layer 850 may be formed over a top surface of the etchstop layer 831. In an embodiment, the absorber layer 850 may comprise tantalum nitride, tantalum boron nitride, or any other suitable material that absorbs the EUV radiation. In an embodiment, a first opening 855 may be formed through the absorber layer 850. For example, the first opening 855 may be formed with a lithography process.

Referring now to FIG. 8B, a cross-sectional illustration after a spacer layer 857 is formed over the exposed surfaces of the absorber layer 850 and the exposed surface of the etchstop layer 831 is shown, in accordance with an embodiment. In an embodiment, the spacer layer 857 may be disposed with a conformal deposition process. As such, the spacer layer 857 may have a substantially uniform thickness over planar surfaces and non-planar surfaces (i.e., the sidewalls of the absorber layer 850). In an embodiment, the spacer layer 857 may be a phase-shift material. For example, the phase-shift spacer layer 857 may comprise one or more of Mo, MoSi, Nb, Zr, C, Ti, Tc, and alloys thereof.

Referring now to FIG. 8C, a cross-sectional illustration after a spacer etch is implemented to form phase-shift spacers 858 is shown, in accordance with an embodiment. In an embodiment, the spacer etch may comprise an etching process that preferentially etches the spacer layer 857 along planar surfaces. Accordingly, phase-shift spacers 858 along the sidewalls of the absorber layer 850 may remain.

In an embodiment, the width W of the phase-shift spacers 858 is dependent on the conformal deposition described above with respect to FIG. 8B. Accordingly, the phase-shift spacers 858 may be referred to as a self-aligned feature since the width W is not dependent on a patterning process that has inherent overlay error.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example 1: a reticle, comprising: a substrate; a mirror layer over the substrate, wherein the mirror layer comprises a plurality of alternating first mirror layers and second mirror layers; and a phase-shift layer over the mirror layer, wherein the phase-shift layer comprises openings for printable features and openings for non-printable features, wherein the non-printable features have a dimension that is smaller than a dimension of the printable features.

Example 2: the reticle of Example 1, wherein the openings for non-printable features are sub-resolution assist features (SRAFs) that are proximate to the openings for the printable features.

Example 3: the reticle of Example 1 or Example 2, wherein a feature dimension of the openings for printable features are approximately four times greater or more than a feature dimension of the SRAFs.

Example 4: the reticle of Examples 1-3, wherein the openings for printable features are shaped for forming vias.

Example 5: the reticle of Examples 1-4, wherein the openings for printable features are shaped for forming lines.

Example 6: the reticle of Examples 1-5, wherein the openings for non-printable features are lines that run substantially parallel to the openings for the printable features.

Example 7: the reticle of Examples 1-6, wherein no absorber layer is formed over the phase-shift layer.

Example 8: the reticle of Examples 1-7, wherein the phase-shift layer comprises one or more of Mo, MoSi, Nb, Zr, C, Ti, Tc, V, W, Re, Rh, Ru and alloys thereof.

Example 9: the reticle of Examples 1-8, wherein the openings for non-printable features encircle openings for the printable features.

Example 10: the reticle of Examples 1-9, further comprising: an absorber layer over the phase-shift layer, wherein the absorber layer is positioned outside a perimeter of the non-printable features.

Example 11: the reticle of Examples 1-10, further comprising: an absorber layer over the mirror layer, wherein the absorber layer contacts a sidewall surface of the phase-shift layer.

Example 12: the reticle of Examples 1-11, wherein a top surface of the phase-shift layer is above a top surface of the absorber layer.

Example 13: a method of forming an extreme ultraviolet (EUV) reticle, comprising: forming a phase-shift layer over a mirror layer; forming a hardmask over the phase-shift layer; patterning the hardmask and the phase-shift layer, wherein the pattern comprises printable openings and non-printable openings; depositing an absorber layer over the phase-shift layer; and removing the absorber layer from the printable openings and the non-printable openings.

Example 14: the method of Example 13, wherein an etchstop layer is formed between the phase-shift layer and the mirror layer.

Example 15: the method of Example 13 or Example 14, wherein the etchstop layer is the same material as the hardmask, and wherein the etchstop layer is a capping layer directly over the mirror layer.

Example 16: the method of Examples 13-15, wherein non-printable openings at least partially surround printable openings.

Example 17: the method of Examples 13-16, wherein the non-printable openings are sub-resolution assist features (SRAFs).

Example 18: the method of Examples 13-17, wherein the phase-shift layer comprises one or more of Mo, MoSi, Nb, Zr, C, Ti, Tc, V, W, Re, Rh, Ru and alloys thereof.

Example 19: the method of Examples 13-18, wherein the openings for printable features are shaped for forming vias.

Example 20: the method of Examples 13-19, wherein the openings for printable features are shaped for forming lines or trenches.

Example 21: the method of Examples 13-20, wherein the openings for non-printable features are lines that run substantially parallel to the openings for the printable features.

Example 22: a method of forming an extreme ultraviolet (EUV) reticle, comprising: disposing a polishing stop layer over an absorber layer, wherein the absorber layer is positioned over a mirror layer and an underlying substrate; forming a first opening through the polishing stop and the absorber layer, wherein the opening exposes a portion of the mirror layer; disposing a phase-shift layer in the first opening; and patterning the phase-shift to form printable openings and non-printable openings.

Example 23: the method of Example 22, further comprising: polishing the phase-shift layer, wherein a top surface of the phase-shift layer is substantially coplanar with a top surface of the polishing stop layer.

Example 24: the method of Example 22 or Example 23, further comprising: removing the polishing stop layer after the phase-shift layer is patterned.

Example 25: the method of Examples 22-24, wherein the non-printable opening are sub-resolution assist features (SRAFs).

What is claimed is:

1. A reticle, comprising:
a substrate;
a mirror layer over the substrate, wherein the mirror layer comprises a plurality of alternating first mirror layers and second mirror layers;
a phase-shift layer over the mirror layer, wherein the phase-shift layer comprises openings for printable features and openings for non-printable features, wherein the non-printable features have a dimension that is smaller than a dimension of the printable features; and
an absorber layer over the phase-shift layer or over the mirror layer.

2. The reticle of claim 1, wherein the openings for non-printable features are sub-resolution assist features (SRAFs) that are proximate to the openings for the printable features.

3. The reticle of claim 2, wherein a feature dimension of the openings for printable features are approximately four times greater or more than a feature dimension of the SRAFs.

4. The reticle of claim 1, wherein the openings for printable features are shaped for forming vias.

5. The reticle of claim 1, wherein the openings for printable features are shaped for forming lines.

6. The reticle of claim 5, wherein the openings for non-printable features are lines that run substantially parallel to the openings for the printable features.

7. The reticle of claim 1, wherein the phase-shift layer comprises one or more of Mo, MoSi, Nb, Zr, C, Ti, Tc, V, W, Re, Rh, Ru and alloys thereof.

8. The reticle of claim 1, wherein the openings for non-printable features encircle openings for the printable features.

9. The reticle of claim 8,
wherein the absorber layer is over the phase-shift layer, and wherein the absorber layer is positioned outside a perimeter of the non-printable features.

10. The reticle of claim 1,
wherein the absorber layer is over the mirror layer, wherein the absorber layer contacts a sidewall surface of the phase-shift layer.

11. The reticle of claim 10, wherein a top surface of the phase-shift layer is above a top surface of the absorber layer.

12. A method of forming an extreme ultraviolet (EUV) reticle, comprising:
forming a phase-shift layer over a mirror layer;
forming a hardmask over the phase-shift layer;
patterning the hardmask and the phase-shift layer, wherein the pattern comprises printable openings and non-printable openings;
depositing an absorber layer over the phase-shift layer; and
removing the absorber layer from the printable openings and the non-printable openings.

13. The method of claim 12, wherein an etchstop layer is formed between the phase-shift layer and the mirror layer.

14. The method of claim 13, wherein the etchstop layer is the same material as the hardmask, and wherein the etchstop layer is a capping layer directly over the mirror layer.

15. The method of claim 12, wherein non-printable openings at least partially surround printable openings.

16. The method of claim 15, wherein the non-printable openings are sub-resolution assist features (SRAFs).

17. The method of claim 12, wherein the phase-shift layer comprises one or more of Mo, MoSi, Nb, Zr, C, Ti, Tc, V, W, Re, Rh, Ru and alloys thereof.

18. The method of claim 12, wherein the openings for printable features are shaped for forming vias.

19. The method of claim 12, wherein the openings for printable features are shaped for forming lines or trenches.

20. The method of claim 19, wherein the openings for non-printable features are lines that run substantially parallel to the openings for the printable features.

21. A method of forming an extreme ultraviolet (EUV) reticle, comprising:
disposing a polishing stop layer over an absorber layer, wherein the absorber layer is positioned over a mirror layer and an underlying substrate;
forming a first opening through the polishing stop and the absorber layer, wherein the opening exposes a portion of the mirror layer;
disposing a phase-shift layer in the first opening; and
patterning the phase-shift to form printable openings and non-printable openings.

22. The method of claim 21, further comprising:
polishing the phase-shift layer, wherein a top surface of the phase-shift layer is substantially coplanar with a top surface of the polishing stop layer.

23. The method of claim 21, further comprising:
removing the polishing stop layer after the phase-shift layer is patterned.

24. The method of claim 21, wherein the non-printable opening are sub-resolution assist features (SRAFs).

* * * * *